(12) United States Patent
Chang et al.

(10) Patent No.: US 8,932,080 B2
(45) Date of Patent: Jan. 13, 2015

(54) ELECTRICAL CONNECTOR WITH IMPROVED SHIELDING MEANS

(71) Applicants: Yen-Chih Chang, New Taipei (TW); Ke-Hao Chen, New Taipei (TW); Chun-Yi Chang, New Taipei (TW)

(72) Inventors: Yen-Chih Chang, New Taipei (TW); Ke-Hao Chen, New Taipei (TW); Chun-Yi Chang, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 18 days.

(21) Appl. No.: 13/737,968

(22) Filed: Jan. 10, 2013

(65) Prior Publication Data

US 2013/0183861 A1 Jul. 18, 2013

(30) Foreign Application Priority Data

Jan. 13, 2012 (TW) .............................. 101101518 A

(51) Int. Cl.
| | |
|---|---|
| *H01R 13/648* | (2006.01) |
| *H01R 12/51* | (2011.01) |
| *H01R 12/52* | (2011.01) |
| *H01R 12/71* | (2011.01) |
| *H05K 7/10* | (2006.01) |
| *H01R 13/24* | (2006.01) |

(52) U.S. Cl.
CPC .............. *H01R 12/51* (2013.01); *H01R 12/52* (2013.01); *H01R 12/714* (2013.01); *H05K 7/1069* (2013.01); *H01R 13/2442* (2013.01)

USPC ....................................................... 439/607.1

(58) Field of Classification Search
USPC ............... 439/607.1, 607.05, 607.08, 607.11, 439/607.12
See application file for complete search history.

(56) References Cited

U.S. PATENT DOCUMENTS

| | | | |
|---|---|---|---|
| 6,027,345 A * | 2/2000 | McHugh et al. ................. | 439/66 |
| 8,167,652 B1 | 5/2012 | Ju | |
| 2013/0237091 A1* | 9/2013 | Mason ..................... | 439/607.05 |

FOREIGN PATENT DOCUMENTS

| | | |
|---|---|---|
| CN | 201994452 U | 9/2011 |
| CN | 202034567 U | 11/2011 |
| CN | 202034574 U | 11/2011 |
| CN | 202067956 U | 12/2011 |
| CN | 202067957 | 12/2011 |

* cited by examiner

*Primary Examiner* — Phuong Dinh
(74) *Attorney, Agent, or Firm* — Wei Te Chung; Ming Chieh Chang

(57) ABSTRACT

An electrical connector for electrically connecting an IC package to a circuit board includes a first insulating housing, a second insulating housing and a plurality of contacts received therein. The contact includes a base portion received in the first insulating housing, and a contacting portion extending upwardly from the base portion and received in the second insulating housing. The first insulating housing includes a first shielding member around the base portion of the contact while the second insulating housing includes a second shielding member around the contacting portion of the contact so that an electrical connector with improved shielding means is provided.

20 Claims, 6 Drawing Sheets

ELECTRICAL CONNECTOR WITH IMPROVED SHIELDING MEANS

BACKGROUND OF THE INVENTION

1. Field of the Invention

The present disclosure relates to an electrical connector for connecting an IC package with a circuit board, and particularly to an electrical connector having improved shielding means.

2. Description of Related Art

U.S. Pat. No. 8,167,652 issued to Ju on May 1, 2012 discloses an electrical connector for interconnecting a chip module to a circuit board. The electrical connector comprises an insulating housing with a plurality of receiving slots for receiving a plurality of contacts, a shielding body disposed on an inner surface of the receiving slot for shielding the contact, and an isolator disposed on the shielding body for preventing the contact from touching the shielding body. The contact comprises a body portion received in the receiving slot and a contacting portion extending upwardly and exposed above the receiving slot for contacting with the chip module. However the shielding body is disposed on the inner surface of the receiving slot and surrounding the body portion of the contact, thus, the shielding body fails to shield the contacting portion so that the EMI (Electromagnetic interference) between the contacting portions has a negative impact on the signal transmission between the chip module and the circuit board.

In view of the above, an improved electrical connector is desired to overcome the problems mentioned above.

SUMMARY OF THE INVENTION

Accordingly, an object of the present disclosure is to provide an electrical connector with improved shielding means.

According to one aspect of the present disclosure, an electrical connector is provided for electrically connecting an IC package to a circuit board. The electrical connector comprises a first insulating housing, a second insulating housing and a plurality of contacts received therein. The contact comprises a base portion received in the first insulating housing, and a contacting portion extending upwardly from the base portion and received in the second insulating housing. The first insulating housing comprises a first shielding member around the base portion of the contact while the second insulating housing comprises a second shielding member around the contacting portion of the contact.

Other objects, advantages and novel features of the disclosure will become more apparent from the following detailed description when taken in conjunction with the accompanying drawings, in which:

DETAILED DESCRIPTION OF THE INVENTION

Reference will now be made to the drawings to describe the present disclosure in detail.

Figure 1:
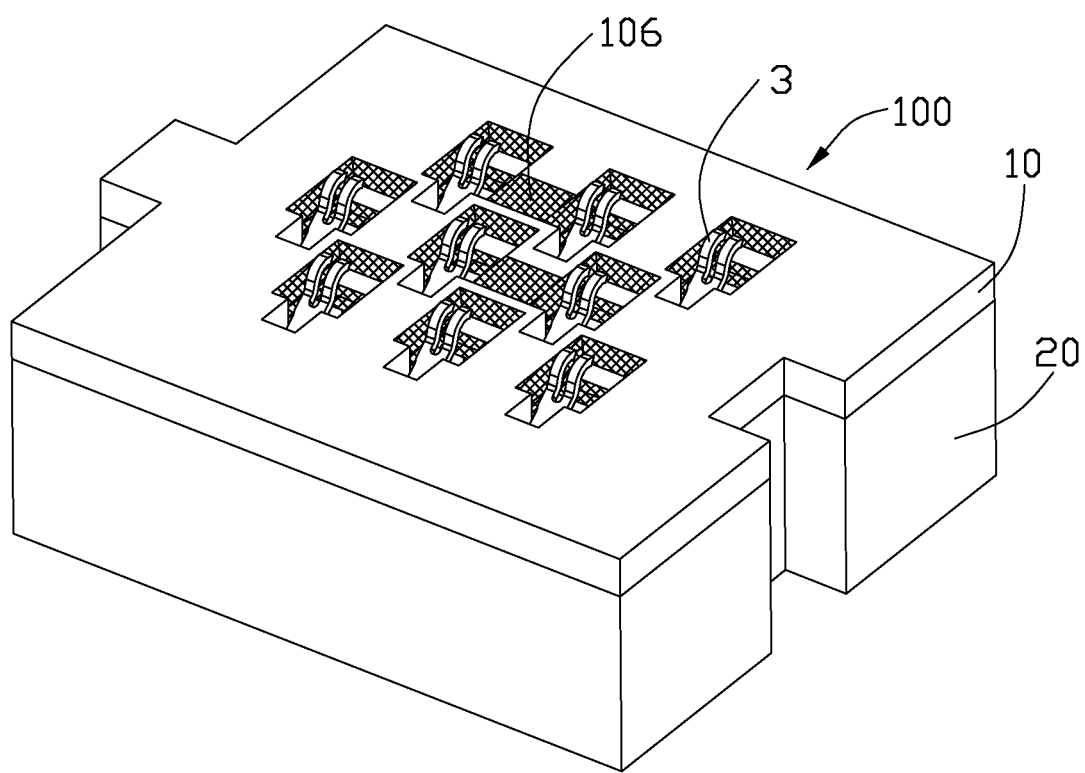
FIG. 1 is an assembled, perspective view of an electrical connector in accordance with a preferred embodiment of the present disclosure.
Figure 2:
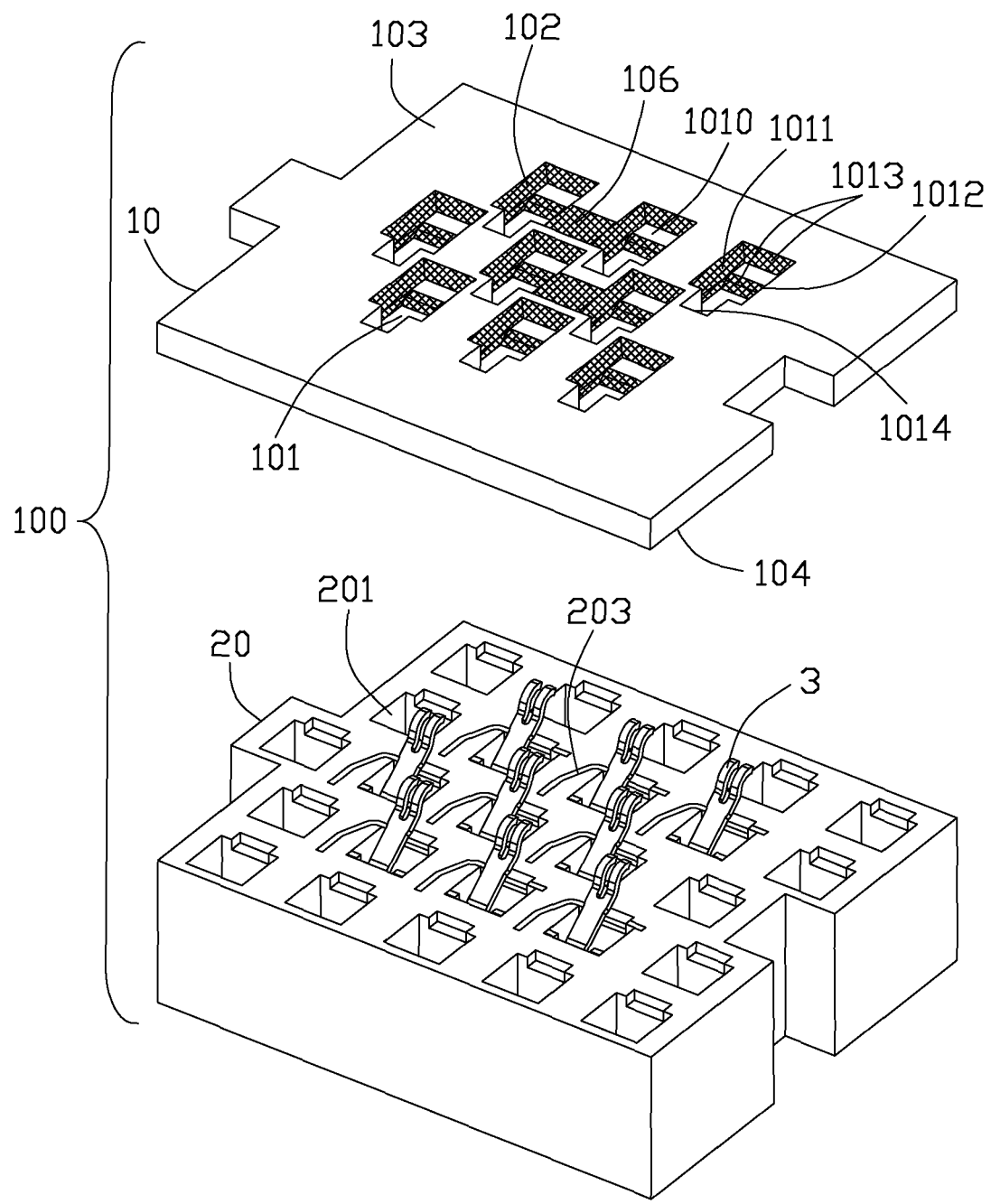
FIG. 2 is a perspective view of the electrical connector shown in FIG. 1, wherein the first insulating housing and the second insulating housing are separated from each other.

Referring to FIG. 1 and FIG. 2, an electrical connector 100 for electrically connecting an IC package (not shown) to a circuit board (not shown) comprises a first insulating housing 20, a second insulating housing or top cover 10 and a plurality of contacts 3 received therein.

Figure 3:
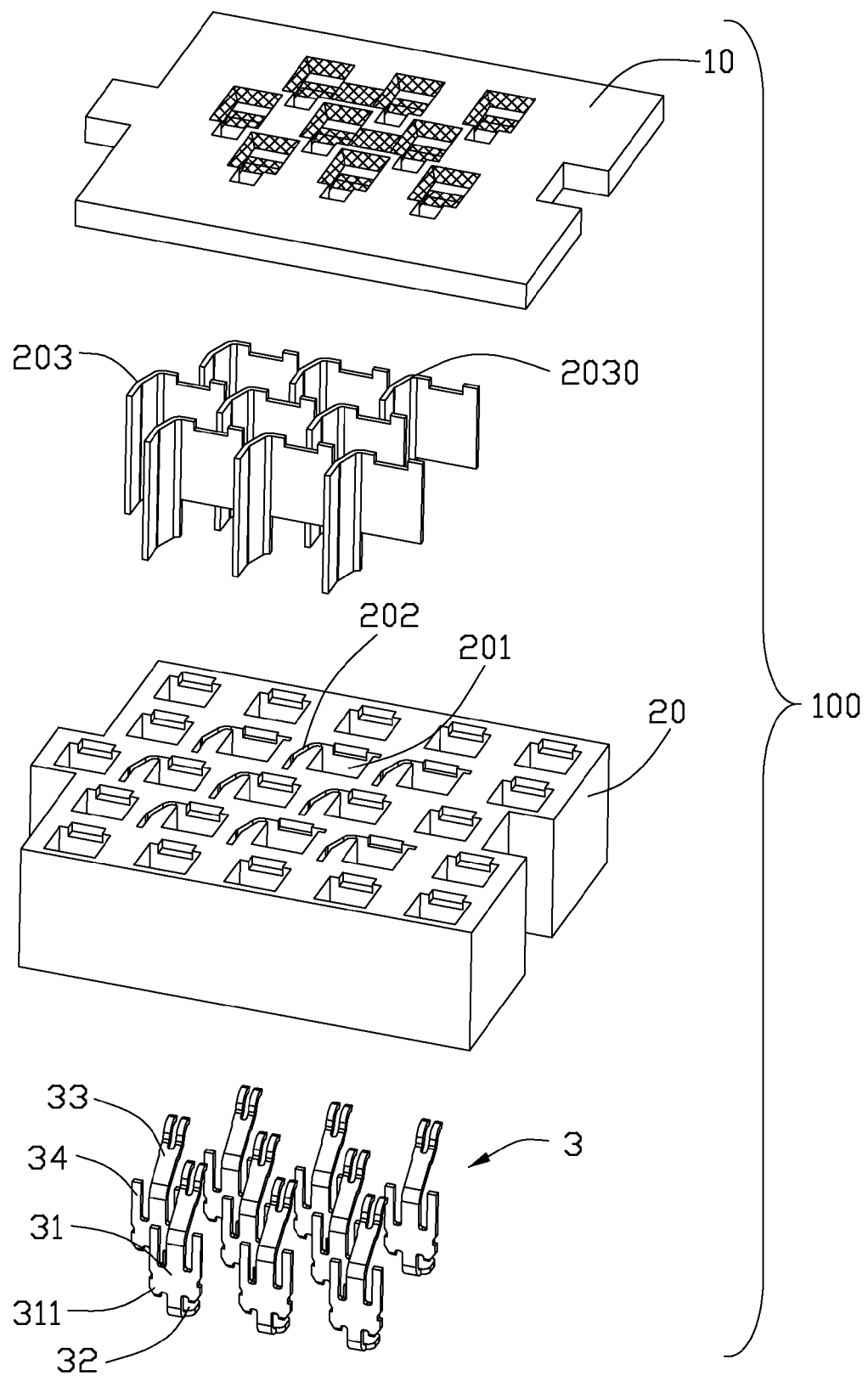
FIG. 3 is an exploded, perspective view of the electrical connector shown in FIG. 1.
Figure 6:
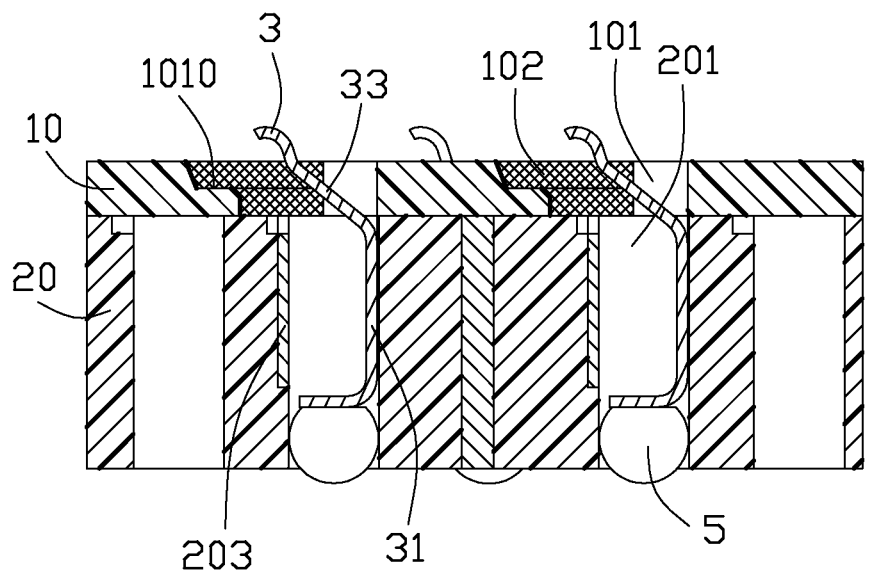
FIG. 6 is a cross sectional view of the electrical connector shown in FIG. 5 along line 6-6.

Referring to FIG. 3, the contact 3 comprises a plate-like base portion 31 extending in an up-to-down direction, a soldering portion 32 extending downwardly from the base portion 31, a contacting portion 33 extending upwardly and obliquely from the base portion 31 and a connection portion 34 extending upwardly and vertically from the base portion 31. The base portion 31 comprises a pair of barbs 311 at two sides for engaging with the first insulating housing 20. Referring to FIG. 6, the soldering portion 32 is substantially perpendicular to the base portion 31 and is used to be soldered on the circuit board via a solder ball 5.

The first insulating housing 20 comprises a plurality of first receiving holes 201 and a plurality of slots 202 communicating with the corresponded first receiving holes 201. The first insulating housing 20 comprises an upper surface. The slot 202 penetrates the upper surface. A plurality of first shielding members 203 are set in the slots 202 for shielding the contacts 3 received in the receiving holes 201. The first shielding member 203 is an L shaped metal plate, and comprises an upper edge 2030.

Figure 4:
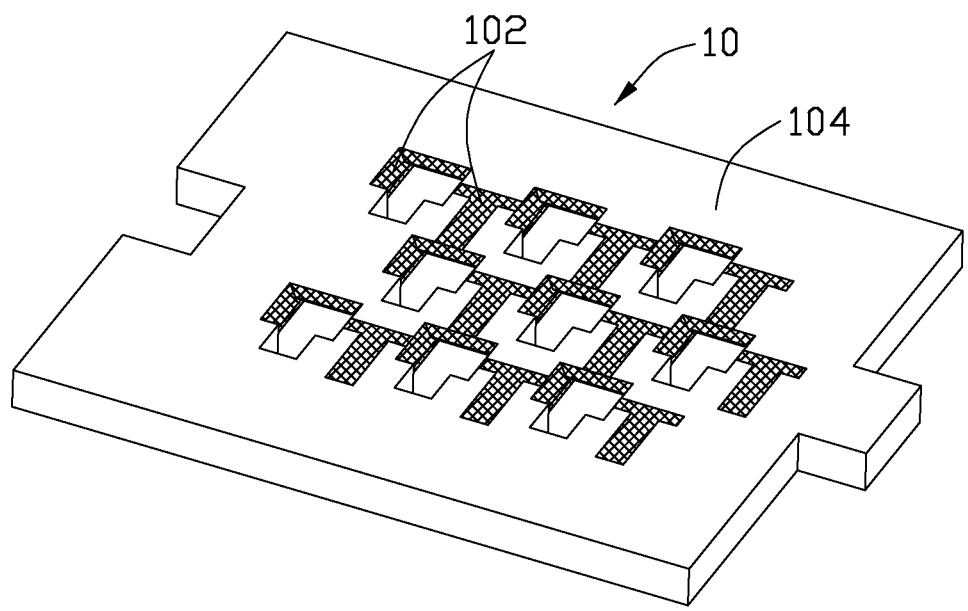
FIG. 4 is a perspective view of the second insulating housing.
Figure 5:
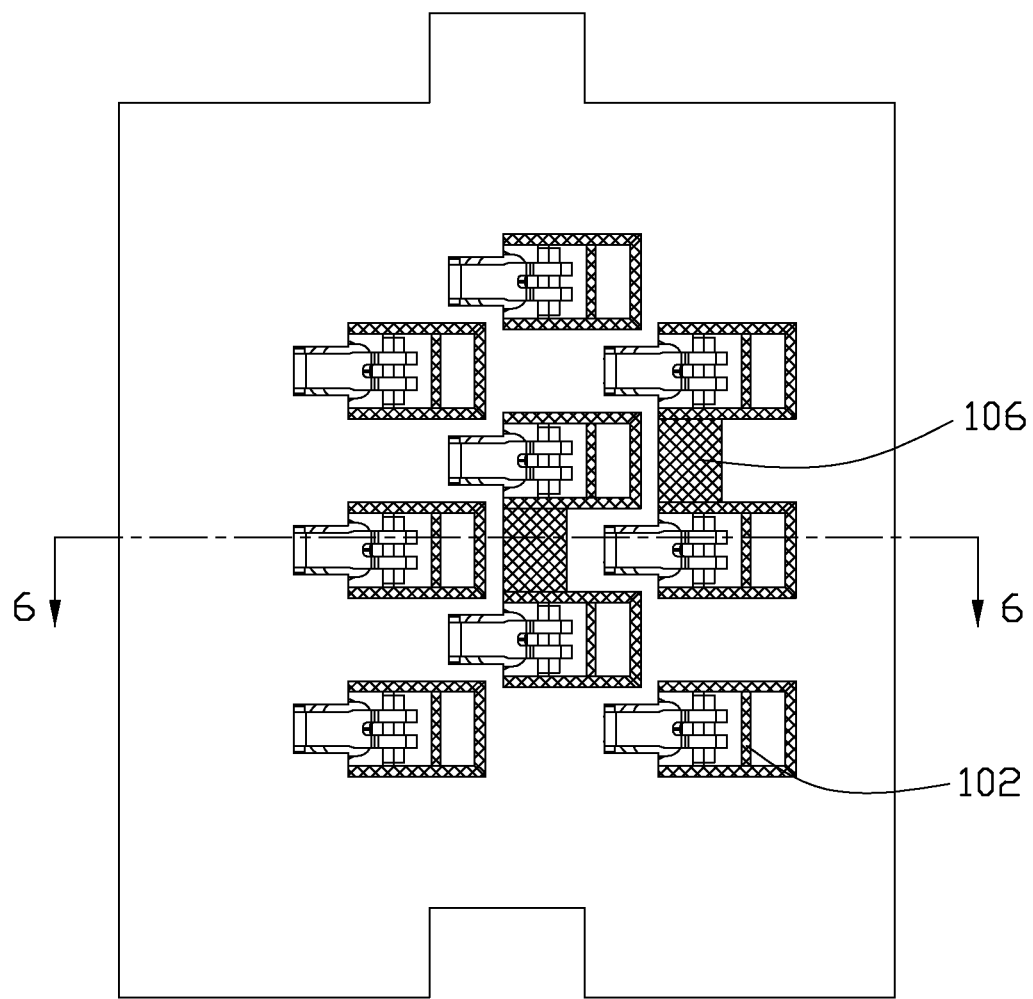
FIG. 5 is a top view of the electrical connector shown in FIG. 1.

Referring to FIG. 2 and FIG. 4, the second insulating housing 10 is separated from the first insulating housing 20. The second insulating housing 10 comprises a top surface 103, a bottom surface 104 and a plurality of second receiving holes 101 running through therebetween. The second receiving hole 101 comprises two lateral surfaces 1011 and 1012, a front surface 1013 and a back surface 1014 opposite to the front surface 1013. A second shielding member 102 is disposed on the lateral surfaces 1011, 1012, the front surface 1013 and the bottom surface 104. The back surface 1014 has no shielding member disposed thereon for the contact 3 leaning against. The second shielding member 102 disposed on the lateral surfaces 1011, 1012, the front surface 1013 and the bottom surface 104 connects with each other. The second shielding member 102 is metal layer formed through LDS (Laser Direct Structuring) skills. The second receiving hole 101 comprises a stepped surface 1010 having no second shielding member 102 disposed thereon for supporting the end of the contacting portion 33. Referring to FIG. 5, at least one grounding feature 106 is formed on the top surface 103 through LDS skills. The grounding feature 106 connects the second shielding member 102 disposed on the lateral surfaces 1011, 1012. The contacting portion 33 extends obliquely in a front-to-back direction which perpendicular to the up-to-down direction. The second receiving hole 101 is larger than the contacting portion 33 and the first receiving hole 201 in the front-to-back direction. The contacting portion 33 is capable of moving downwardly and accommodated in the second receiving hole 101 when pressed by the IC package.

In assembling, the first shielding member 203 is assembled to the slot 202 from the up-to-down direction while the contact 3 is assembled to the first receiving hole 201 in the same manner. The contact 3 is retained in the receiving hole 201 through the barbs 311 engaged with the first insulating housing 20. The first shielding member 203 is located around two adjacent sides of the base portion 31. The upper edge 2030 is disposed on the upper surface of the first insulating housing 20. The second insulating housing 10 is assembled on the upper surface of the first insulating housing 20. The contacting portion 33 is located in the second receiving hole 101 with the end of the contacting portion 33 extending above the top surface 103 of the second insulating housing 10 for contacting the IC package. The second shielding member 102 disposed on the bottom surface 104 of the second insulating housing 10 connects the upper edge 2030 of first shielding member 203. So the second shielding member 102 together with the first shielding member 203 provides a completed shielding system for the whole contact 3. According to the above described embodiment of the present disclosure, an electrical connector 100 of the present disclosure having a better shielding effect is provided.

While preferred embodiments in accordance with the present disclosure has been shown and described, equivalent modifications and changes known to persons skilled in the art according to the spirit of the present disclosure are considered within the scope of the present disclosure as defined in the appended claims.

What is claimed is:

1. An electrical connector for electrically connecting an IC package to a circuit board comprising:
   a first insulating housing;
   a second insulating housing mounted upon the first insulating housing and separated from the first insulating housing; and
   a plurality of contacts each comprising a base portion retained in the first insulating housing and a deflectable contacting portion extending upwardly obliquely and received in the second insulating housing; wherein
   the first insulating housing comprises at least one first shielding member around the base portion of the contact while the second insulating housing comprises at least one second shielding member around the contacting portion, and connecting with the first shielding member.

2. The electrical connector as claimed in claim 1, wherein the first insulating housing and the second insulating housing define a thickness in an up-to-down direction respectively, and the thickness of the first insulating housing is greater than the thickness of the second insulating housing.

3. The electrical connector as claimed in claim 1, wherein the first insulating housing comprises at least one slot around two adjacent sides of the contact, and the first shielding member is a metal plate assembled in the slot.

4. The electrical connector as claimed in claim 1, wherein the end of the contacting portion extends beyond the second insulating housing and is capable of moving downwardly and accommodated within the second insulating housing when pressed by an IC package.

5. The electrical connector as claimed in claim 1, wherein the second shielding member is metal layer formed through LDS (laser direct structuring) skills.

6. The electrical connector as claimed in claim 5, wherein the second insulating housing comprises a plurality of second receiving holes each having two lateral surfaces, a front surface and a back surface, the contact lean against the back surface, and wherein the second shielding member is disposed on the two lateral surfaces and the front surface.

7. The electrical connector as claimed in claim 6, wherein the second receiving hole comprises a stepped surface having no second shielding member for supporting the contacting portion when it is pressed down by the IC package.

8. The electrical connector as claimed in claim 6, wherein the second insulating housing comprises a bottom surface facing the first insulating housing and a top surface opposite to the bottom surface, and wherein the second shielding member is disposed on partial of the bottom surface and connects the second shielding member disposed on the lateral surfaces and the front surface.

9. The electrical connector as claimed in claim 8, wherein the second shielding member disposed on the bottom surface of the second insulating housing connects the first shielding member.

10. The electrical connector as claimed in claim 8, wherein at least one grounding feature is formed on the top surface of the second insulating housing through LDS (laser direct structuring) technologies, and wherein the grounding feature connects the second shielding member.

11. An electrical connector for electrically connecting an IC package to a circuit board comprising:
    an insulating housing having a first receiving hole and a second receiving hole upon the first receiving hole in an up-to-down direction and communicating with the first receiving hole; and
    a plurality of contacts each comprising a base portion received in the first receiving hole, and a contacting portion extending beyond the second receiving hole for contacting with the IC package, the contacting portion extending upwardly and obliquely in a front-to-back direction perpendicular to the up-to-down direction; wherein
    the dimension of the second receiving hole is larger than the first receiving hole and the contacting portion in the front-to-back direction; and wherein
    a first shielding member is set in the insulating housing and around the first receiving hole while a second shielding member is partially disposed on surfaces of the second receiving hole.

12. The electrical connector as claimed in claim 11, wherein the insulating housing comprises a first insulating housing and a second insulating housing assembled upon the first insulating housing, and wherein the first receiving hole is set in the first insulating housing while the second receiving hole is set in the second insulating housing.

13. The electrical connector as claimed in claim 12, wherein the first insulating housing comprises at least one slot around two adjacent sides of the first receiving hole, and the first shielding member is metal plate received in the slot with an upper edge exposed on an upper surface of the first insulating housing.

14. The electrical connector as claimed in claim 13, wherein the second insulating housing comprises a bottom surface facing the first insulating housing, the second shielding member is disposed on partial of bottom surface, and wherein the second shielding member disposed on the bottom surface connects the upper edge of the first shielding member.

15. The electrical connector as claimed in claim 11, wherein at least one grounding feature is disposed on a top surface of the insulating housing and connecting with the second shielding member, and wherein the grounding feature and the second shielding member are formed through LDS (laser direct structuring) skills.

16. An electrical connector comprising:
    an insulative housing defining a plurality of receiving holes arranged in rows and columns in a staggered manner with at least first, second and third rows of contacts each extending along a row direction while all of said first, second and third rows of contacts arranged in sequence along a column direction wherein a first row of receiving holes are offset from a second row of receiving holes while aligned with a third row of contacts in, each of said receiving holes being equipped with a shielding member defining an L-shaped cross-sectional configuration in a top view;

a plurality of contacts disposed in the corresponding receiving holes, respectively, each of said contacts including a base portion retained in the corresponding receiving hole and a resilient contacting portion extending beyond the housing, wherein said L-shaped cross-sectional configuration essentially consists of a first part extending along said row direction and intimately located around a side edge of the corresponding receiving hole, and a second part linked to said first part while extending around another side edge of the corresponding receiving hole and terminated around an extended centerline of the neighboring receiving hole in the neighboring row.

17. The electrical connector as claimed in claim 16, wherein the second part is longer than the first part in a vertical direction perpendicular to both said row direction and said column direction.

18. The electrical connector as claimed in claim 16, further including an insulative top cover positioned upon the housing and defining a plurality of receiving apertures in alignment with the corresponding receiving holes, respectively, wherein a thickness of said top cover is less than one half of that of the housing and the contacting portion of the contact is primarily received in the corresponding receiving aperture except a contact apex area thereof.

19. The electrical connector as claimed in claim 18, wherein each of said receiving aperture is equipped with a shielding layer covering a first side along the row direction and another side along the column direction corresponding to the L-shaped cross-sectional configuration in a vertical direction perpendicular to both said column direction and said row direction.

20. The electrical connector as claimed in claim 19, wherein each of said receiving apertures defines a step which is located at a position adapted to confront the deflected contacting portion without the shielding layer thereon.

* * * * *